United States Patent
Wang et al.

(10) Patent No.: US 8,455,757 B2
(45) Date of Patent: Jun. 4, 2013

(54) SOLAR CELL WITH ELECTRON INHIBITING LAYER

(75) Inventors: Marilyn Wang, Shanghai (CN); Zhi Zheng, Shanghai (CN); Wei Jun Wang, Shanghai (CN); Linan Zhao, Shanghai (CN); Xuanbin Liu, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 380 days.

(21) Appl. No.: 12/542,474

(22) Filed: Aug. 17, 2009

(65) Prior Publication Data

US 2013/0104987 A1 May 2, 2013

Related U.S. Application Data

(60) Provisional application No. 61/090,422, filed on Aug. 20, 2008.

(51) Int. Cl.
*H01L 31/00* (2006.01)
(52) U.S. Cl.
USPC .......................................... 136/263; 136/265
(58) Field of Classification Search
USPC ................. 136/252, 258, 261, 262, 263, 264, 136/265
See application file for complete search history.

(56) References Cited

U.S. PATENT DOCUMENTS

| 4,427,749 A | 1/1984 | Graetzel et al. |
|---|---|---|
| 4,927,721 A | 5/1990 | Gratzel et al. |
| 5,677,545 A | 10/1997 | Shi et al. |
| 6,278,056 B1 | 8/2001 | Sugihara et al. |
| 6,566,595 B2 | 5/2003 | Suzuki |
| 6,861,722 B2 | 3/2005 | Graetzel et al. |
| 6,919,119 B2 | 7/2005 | Kalkan et al. |
| 6,936,143 B1 | 8/2005 | Graetzel et al. |
| 7,032,209 B2 | 4/2006 | Kobayashi |
| 7,042,029 B2 | 5/2006 | Graetzel et al. |
| 7,091,136 B2 | 8/2006 | Basol |

(Continued)

FOREIGN PATENT DOCUMENTS

| EP | 1473745 | 11/2004 |
|---|---|---|
| EP | 1689018 | 8/2006 |

(Continued)

OTHER PUBLICATIONS

Diguna et al., "High Efficiency of CdSe Quantum-Dot-Sensitized TiO2 Inverse Opal Solar Cells," Applied Physics Letters, vol. 91, No. 023116, 3 pages, 2007.

(Continued)

*Primary Examiner* — Alexander Kollias
(74) *Attorney, Agent, or Firm* — Seager Tufte & Wickhem LLC.

(57) ABSTRACT

An illustrative solar cell may include an electron conductor, an absorber, a hole conductor, and one or more other layers that help reduce interfacial charge recombination within the solar cell for improved solar cell efficiency. In one example, an electron inhibiting/hole transporting layer is provided that blocks or at least substantially inhibits movement of electrons that may otherwise move from within the absorber and/or electron conductor into the hole conductor of the solar cell, while permitting holes to travel from the absorber to the hole conductor. In some cases, the electron inhibiting/hole transporting layer may be transparent or substantially transparent to incident light so that the incident light may reach the absorber material.

8 Claims, 2 Drawing Sheets

U.S. PATENT DOCUMENTS

| | | | |
|---|---|---|---|
| 7,202,412 | B2 | 4/2007 | Yamanaka et al. |
| 7,202,943 | B2 | 4/2007 | Chang et al. |
| 7,268,363 | B2 | 9/2007 | Lenhard et al. |
| 7,462,774 | B2 | 12/2008 | Roscheisen et al. |
| 7,563,507 | B2 | 7/2009 | Emrick et al. |
| 7,655,860 | B2 | 2/2010 | Parsons |
| 2005/0028862 | A1 | 2/2005 | Miteva et al. |
| 2006/0021647 | A1 | 2/2006 | Gui et al. |
| 2006/0169971 | A1 | 8/2006 | Cho et al. |
| 2006/0263908 | A1 | 11/2006 | Hirai |
| 2007/0025139 | A1 | 2/2007 | Parsons |
| 2007/0028959 | A1 | 2/2007 | Lee et al. |
| 2007/0062576 | A1 | 3/2007 | Duerr et al. |
| 2007/0119048 | A1 | 5/2007 | Li et al. |
| 2007/0120177 | A1 | 5/2007 | McGregor et al. |
| 2007/0122927 | A1 | 5/2007 | Li et al. |
| 2007/0123690 | A1 | 5/2007 | Parham et al. |
| 2007/0243718 | A1 | 10/2007 | Shiratori et al. |
| 2008/0110494 | A1* | 5/2008 | Reddy ........................ 136/255 |
| 2008/0223445 | A1* | 9/2008 | Marks et al. ................ 136/263 |
| 2008/0264479 | A1 | 10/2008 | Harris et al. |
| 2009/0114273 | A1 | 5/2009 | Kamat |
| 2009/0159120 | A1* | 6/2009 | Wang et al. ................ 136/252 |
| 2009/0159124 | A1 | 6/2009 | Mihaila et al. |
| 2009/0159131 | A1 | 6/2009 | Zheng et al. |
| 2009/0159999 | A1 | 6/2009 | Zheng et al. |
| 2009/0211634 | A1 | 8/2009 | Serban et al. |
| 2009/0260682 | A1 | 10/2009 | Serban et al. |
| 2009/0260683 | A1 | 10/2009 | Serban et al. |
| 2009/0283142 | A1 | 11/2009 | Serban et al. |
| 2009/0308442 | A1 | 12/2009 | Liu |
| 2010/0006148 | A1 | 1/2010 | Zheng et al. |
| 2010/0012168 | A1 | 1/2010 | Mihaila et al. |
| 2010/0012191 | A1 | 1/2010 | Serban et al. |
| 2010/0043874 | A1 | 2/2010 | Liu |
| 2010/0116326 | A1 | 5/2010 | Gur et al. |
| 2010/0193025 | A1 | 8/2010 | Serban et al. |
| 2010/0193026 | A1 | 8/2010 | Serban et al. |
| 2010/0326499 | A1 | 12/2010 | Liu |

FOREIGN PATENT DOCUMENTS

| | | |
|---|---|---|
| EP | 1936644 | 6/2008 |
| JP | 2008177099 | 7/2008 |
| WO | WO 2004/017345 | 2/2004 |
| WO | WO 2006/073562 | 7/2006 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |

OTHER PUBLICATIONS

Afzal, "Studies of Cephradine Metal Interactions," 342 pages, Oct. 1998.

Anacona et al., "Synthesis and Antibacterial Activity of Cefotaxime Metal Complexes," Journal of the Chilean Chemical Society, vol. 50, No. 2, Jun. 2005, pp. 447-450.

Anacona et al., "Synthesis and Antibacterial Activity of Cefoxitin Metal Complexes," Transition Metal Chemistry, vol. 30, pp. 605-609, 2005.

Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.

Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.

Diol Et al., "Electron Transfer Dynamics at GaAs Surface Quantum Wells," Journal of Physical Chemistry B, vol. 102, pp. 6193-6201, 1998.

El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.

Enright et al., "Spectroscopic Determination of Electron and Hole Effective Masses in a Nanocrystalline Semiconductor Film," Journal of Physical Chemistry vol. 100, No. 3, pp. 1027-1035, 1996.

Galoppini, "Linkers for Anchoring Sesitizers to Semiconductor Nanoparticles," Coordination Chemistry Reviews vol. 248, pp. 1283-1297, 2004.

Gautam et al., "Soft Chemical Routes to Semiconductor Nanostructures," Pramana Journal of Physics, vol. 65, No. 4, pp. 549-564, Oct. 2005.

Gregg, "Excitonic Solar Cells," Journal of Physical Chemistry B., vol. 107, pp. 4688-4698, No. 20, May 1, 2003.

Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.

http://en.wikipedia.org/wiki/Quantum_dot_solar_cell, "Nanocrystal Solar Cell," 1 page, printed Oct. 17, 2007.

http://findarticles.com/articles/mi_qa3776/is_200605ai_n17176721/print, "Ultradense GaN Nanopillar and Nanopore Arrays by Self-Assembly Nanopatterning," 4 pages, May 5, 2008.

http://www.evidenttech.com, Evident Technologies Webpages, 11 pages, printed Oct. 17, 2007.

http://www.i-sis.org.uk/QDAUESC.php, "Quantum Dots and Ultra-Efficient Solar Cells?" ISIS Press Release, Jan. 19, 2006.

Hwang et al., "A Highly Efficient Organic Sensitizer for Dye-Sensitized Solar Cells," Chemical Communications, printed Sep. 27, 2007, issue 47, pp. 4887-4889.

Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.

Kim et al., "Enhanced Photocatalytic Activity in Composites of $TiO_2$ Nanotubes and Cds Nanoparticles," Chem. Commun., pp. 5024-5026, 2006.

Klimov, "Spectral and Dynamical Properties of Multiexcitons in Semiconductor Nanocrystals," ANRV, vol. 308-PC58-24, pp. 635-673, Dec. 2, 2006.

Kouklin et al., "Ultradense GaN Nanopillar and Nanopore Arrays by Self-Assembly and Nanopatterning," Journal of Electronic Materials, vol. 35, No. 5, pp. 1133-1137, May 2006.

Kuzyk, "Erratum: Physical Limits on Electronic Nonlinear Molecular Susceptibilities," Physical Review Letters, vol. 90, No. 3, Jan. 2003, p. 039902-1.

Kuzyk, "Fundamental Limits on Third-Order Molecular Susceptibilities," Optics Letters, vol. 25, No. 16, pp. 1183-1185, Aug. 15, 2000.

Kuzyk, "Physical Limits on Electronic Nonlinear Molecular Susceptibilities," Physical Review Letters, vol. 85, No. 6, pp. 1218-1221, Aug. 7, 2000.

Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.

Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.

Li et al., "Band-Structure-Corrected Local Density Approximation Study of Semiconductor Quantum Dots and Wires," Physical Review B., vol. 72, 2005, pp. 125325-1-125325-15.

Li et al., "Conducting Polythiophenes with a Broad Spectrum of Reactive Groups," Journal of Polymer Science A, Polymer Chemistry, vol. 43, pp. 4547-4558, 2005.

Li et al., "Review of Recent Progress in Solid-State Dye-Sensitized Solar Cells," Solar Energy Materials and Solar Cells, vol. 90, pp. 549-573, 2006.

Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.

Marcus et al, "Electron Transfers in Chemistry and Biology," Biochimica et Biophysica Acta, vol. 811, pp. 265-322, 1985.

Marcus et al., "Electron Transfer Reactions in Chemistry, Theory and Experiment," Reviews of Modern Physics, vol. 65, No. 3, pp. 599-610, Jul. 1993.

Marcus, "Electrostatic Free Energy and Other Properties of States Having Nonequilibrium Polarization. I," The Journal of Chemical Physics, vol. 24, No. 5, May 1956, pp. 979-989.

Marcus, "On the Theory of Oxidation-Reduction Reactions Involving Electron Transfer. I," The Journal of Chemical Physics, vol. 24, No. 5, May 1956, pp. 966-978.

Meier et al., "Fast Electron Transfer Across Semiconductor-Molecule Interfaces: GaAs/Co(Cp)$_2$," Journal of Physical Chemistry B., vol. 103, pp. 2122-2141, 1999.

Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.

Morrison et al., Organic Chemistry, Sixth Edition, Chapter 6, pp. 240-242, 1992.

Neale et al., "Effect of a Coadsorbent on the Performance of Dye-Sensitized TiO$_2$ Solar Cells: Shielding Versus Band-Edge Movement," Journal of Physical Chemistry B., vol. 109, No. 49, pp. 23183-23189, 2005.

Nilsing et al., "Phosphonic Acid Adsorption at the TiO$_2$ Anatase (101) Surface Investigated by Periodic Hybrid HF-DFT Computations," Surface Science, vol. 582, pp. 49-60, 2005.

Nozick et al., "Quantum Dot Solar Cells," Physica E, vol. 14, pp. 115-120, 2002.

O'Reagan et al., "A Low-Cost, High Efficiency Solar Cell Based on Dye-Sensitized Colloidal TiO$_2$ Films," Nature, vol. 353, pp. 737-740, Oct. 24, 1991.

Oyaizu et al., "Linear Ladder-Type Conjugated Polymers Composed of Fused Thiophene Ring Systems," Macromolecules, vol. 37, No. 4, pp. 1257-1270, 2004.

Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.

Perez-Moreno et al., "Modulated Conjugation as a Means for Attaining a Record High Intrinsic Hyperpolarizability," Optics Letters, vol. 32, No. 1, pp. 59-61, Jan. 1, 2007.

Pomerantz et al., "Synthesis and Properties of Poly[3-(w-bromoalkyl)thiophene]," Synthetic Metals, vol. 101, 1 page, 1999.

Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.

Qian et al., "Gallium Nitride-Based Nanowire Radial Heterostructures for Nanophotonics," NanoLetters, vol. 4, No. 10, pp. 1975-1979, 2004.

Qiu et al., "Fabrication of TiO$_2$ Nanotube Film by Well-Aligned ZnO Nanorod Array Film and Sol-Gel Process," Thin Solid Films, vol. 515, pp. 2897-2902, 2007.

Robel et al., "Quantum Dot Solar Cells, Harvesting Light Energy with CdSe Nanocrystals Molecularly Linked to Mesoscopic TiO2 Films," Journal of the American Chemical Society, vol. 128, No. 7, pp. 2385-2393, 2006.

Robel et al., "Size-Dependent Electron Injection from Excited CdSeQuantum Dots into TiO$_2$ Nanoparticles," JACS Communications, Mar. 21, 2007, vol. 129 pp. 4136-4137.

Wang et al. "Enhance the Performance of Dye-Sensitized Solar Cells by Co-grafting Amphiphilic Sensitizer and Hexadecylmalonic Acid on TiO$_2$ Nanocrystals," Journal of Physical Chemistry B., vol. 107, No. 51, pp. 14336-14341, 2003.

Wu et al., "Superior Radiation Resistance of In$_{1-x}$Ga$_x$N Alloys: Full-Solar-Spectrum Photovoltaic Material System," Journal of Applied Physics, vol. 24, No. 10, pp. 6477-6482, Nov. 15, 2003.

Xu et al., "New Triphenylamine-Based Dyes for Dye-Sensitized Solar Cells," Journal of Physical Chemistry C, vol. 112, No. 3, pp. 874-880, 2008.

Yum et al., "Efficient Co-Sensitization of Nanocrystalline TiO$_2$ Films by Organic Sensitizers," Chemical Communications, printed Sep. 27, 2007, issue 44, pp. 4680-4682.

Dennler et al., "Polymer-Fullerene Bulk-Heterojunction Solar Cells," Advanced Materials, vol. 21, pp. 1323-1338, 2009.

Banerjee et al., "Synthesis and Characterization of Carbon Nanotube-Nanocrystal Heterostructures," Nano Letters, vol. 2, No. 3, pp. 195-200, 2002.

Clarke et al., "Photophysics of Dopamine-Modified Quantum Dots and Effects on Biological Systems," Nature Materials, vol. 5, pp. 409-417, May 2006.

Gebeyehu et al., "Hybrid Solar Cells Based on Dye-Sensitized Nanoporous TiO$_2$ Electrodes and Conjugated Polymers as Hole Transport Materials," Synthetic Metals, vol. 125, pp. 279-287, 2002.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.

Landes et al., "On the Nanoparticle to Molecular Size Transition: Flourescence Quenching Studies," vol. 105, No. 43, pp. 10554-10558, 2001.

Law et al., "ZnO-Al$_2$O$_3$ and ZnO-TiO$_2$ Core-Shell Nanowire Dye-Sensitized Solar Cells," Journal Phys. Chemistry B, vol. 110, No. 45, pp. 22652-22663, 2006.

Leschkies et al., "Photosensitization of ZnO Nanowires with CdSe Quantum Dots for Photovoltaic Devices," Nano Letters, vol. 7, No. 6, pp. 1793-1798, 2007.

Ma et al., "A Sensitive Method for the Detection of Catecholamine Based on Fourescence Quenching of CdSe Nanocrystals," Talanta, vol. 67, pp. 979-983, 2005.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 2008, pp. 1-7.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Plass et al., "Quantum Dot Sensitization of Organic-Inorganic Hybrid Solar Cells," Journal Phys. Chemistry B, vol. 106, No. 31, pp. 7578-7580, 2002.

Quintana et al., "Comparison of Dye-Sensitized ZnO and TiO$_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).

Sharma et al., "Photoinduced Charge Transfer Between CdSe Quantum Dots and p-Phenylenediamine," Journal Phys. Chemistry B, vol. 107, No. 37, pp. 10088-10093, 2003.

Snaith et al., "Self-Organization of Nanocrystals in Polymer Brushes. Application in Heterojunction Photovoltaic Diodes," Nano Letters, vol. 5, No. 9, pp. 1653-1657, 2005.

Wu et al., "Phosphate-Modified TiO$_2$ Nanoparticles for Selective Detection of Dopamine, Levodopa, Adrenaline, and Catechol Based on Flourescence Quenching," Langmuir, vol. 23, No. 14, pp. 7880-7885, 2007.

Zhai et al., "A Simple Method to Generate Side-Chain Derivatives of Regioregular Polythiophene Via the Grim Metathesis and Post-Polymerization Functionalization," Macromolecules, vol. 36, No. 1, pp. 61-64, 2003 (published on web Dec. 14, 2002).

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

U.S. Appl. No. 13/006,410, filed Jan. 13, 2011.

Rafaelle et al., "Quantum Dot—Single Wall Carbon Nanotube Complexes for Polymeric Solar Cells,", 2005, Photovoltaic Specialists Conference.

Shen et al., "Photacoustic and Photoelectrochemical Characterization of CdSe-Sensitized TiO$_2$ Electrodes Composed of Nanotubes and Nanowires," Thin Solid Films, vol. 499, pp. 299-305, 2006.

Chang et al., "Chemical Bath Deposition of CdS Quantum Dots Onto Mesoscopic TiO$_2$ Films for Application in Quantum-Dot-Sensitized Solar Cells," Applied Physics Letters, vol. 91, 2007, pp. 053503-1-053503-3.

U.S. Appl. No. 12/433,560, filed Aril 30, 2009.

U.S. Appl. No. 12/423,581, filed Apr. 14, 2009.

U.S. Appl. No. 12/484,034, filed Jun. 12, 2009.

U.S. Appl. No. 12/468,755, filed May 19, 2009.

U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.

Hodes, "Chemical Solution Deposition of Semiconductor Films," Marcel Dekker Inc., 381 pages, 2002.
Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.

* cited by examiner

SOLAR CELL WITH ELECTRON INHIBITING LAYER

PRIORITY

This application claims priority under 35 U.S.C. §119 to U.S. Provisional Application Ser. No. 61/090,422 entitled "SOLAR CELL WITH ELECTRON INHIBITING LAYER" filed Aug. 20, 2008, the entire disclosure of which is herein incorporated by reference.

TECHNICAL FIELD

The disclosure relates generally to solar cells, and more particularly to solar cells that include a layer or layers that reduce interfacial charge recombination for improved solar cell efficiency.

SUMMARY

The present disclosure relates generally to solar cells that include a layer or layers that reduce interfacial charge recombination for improved solar cell efficiency. In some instances, a solar cell, such as a quantum dot (QD) solar cell or dye-sensitized solar cell (DSC), may include a layer that blocks or at least substantially inhibits movement of electrons that may otherwise move from within an absorber and/or an electron conductor into a hole conductor. The layer may permit holes to travel from the absorber to the hole conductor (e.g., permit electrons to move from the hole conductor to the absorber).

An illustrative but non-limiting example may be found in a solar cell that has an electron conductor layer, an absorber layer and a hole conductor layer. An electron inhibiting/hole transporting layer may be disposed between the absorber layer and the hole conductor layer. As noted above, and in some cases, the absorber layer may include quantum dots (QD) and/or a photosensitive dye. In some instances, the electron inhibiting/hole transporting layer may be considered as being configured to block or at least substantially inhibit electrons in the absorber layer and/or the electron conductor layer from reaching the hole conductor layer, yet may permit holes to travel from the absorber layer to the hole conductor layer.

Another illustrative but non-limiting example may be found in a solar cell that has an electron conductor that is made of or otherwise includes titanium dioxide. The solar cell may have a quantum dot layer that includes CdSe quantum dots, a hole conductor, and an electron inhibiting/hole transporting layer that is disposed between the quantum dot layer and the hole conductor layer. In some instances, the hole conductor layer may be made of or otherwise include the following structure:

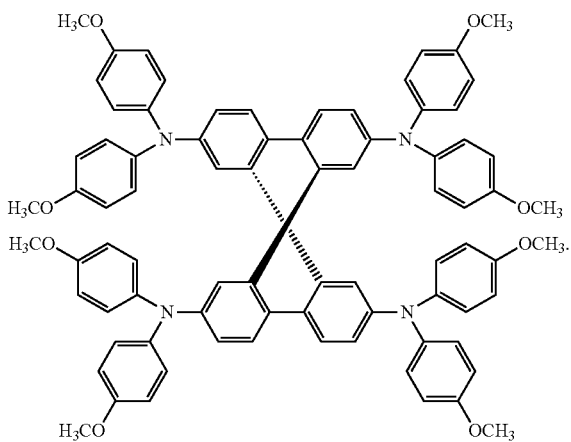

Another illustrative but non-limiting example may be found in a solar cell that has an electron conductor that is made of or otherwise includes titanium dioxide. The solar cell may have a quantum dot layer that includes CdSe quantum dots, a hole conductor layer, and an electron inhibiting/hole transporting layer that is disposed between the quantum dot layer and the hole conductor layer. In some instances, the hole conductor layer may be made of or otherwise include the following structure:

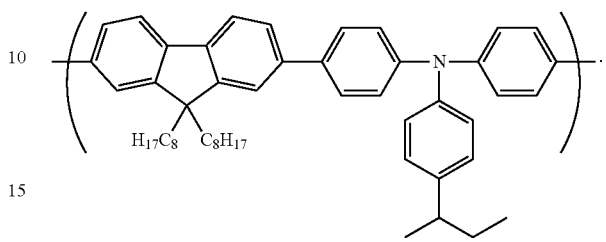

Another illustrative but non-limiting example may be found in a solar cell that has an electron conductor that is made of or otherwise includes titanium dioxide. The solar cell may have a quantum dot layer that includes PbS quantum dots, a hole conductor layer, and an electron inhibiting/hole transporting layer that is disposed between the quantum dot layer and the hole conductor layer. In some instances, the hole conductor layer may be made of or otherwise include the following structure:

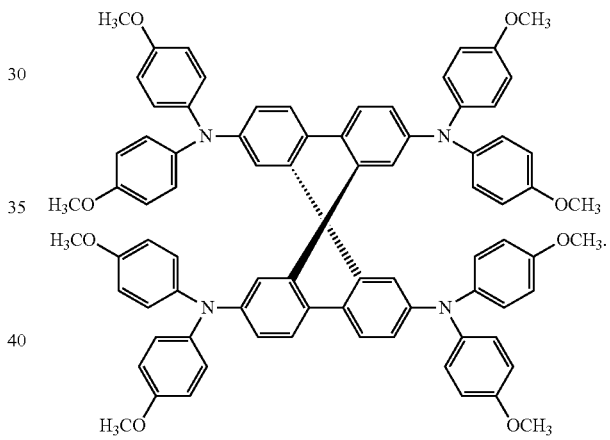

Another illustrative but non-limiting example may be found in a solar cell that has an electron conductor that is made of or otherwise includes titanium dioxide. The solar cell may have a quantum dot layer that includes PbS quantum dots, a hole conductor layer, and an electron inhibiting/hole transporting layer that is disposed between the quantum dot layer and the hole conductor layer. In some instances, the hole conductor layer may be made of or otherwise include the following structure:

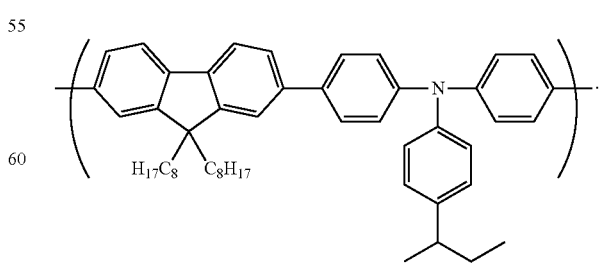

The above summary is not intended to describe each and every embodiment or every implementation of the disclosure.

The Description that follows more particularly exemplifies various illustrative embodiments.

BRIEF DESCRIPTION OF THE FIGURES

The following description should be read with reference to the drawings. The drawings, which are not necessarily to scale, depict selected embodiments and are not intended to limit the scope of the disclosure. The disclosure may be more completely understood in consideration of the following detailed description of various embodiments in connection with the accompanying drawings, in which.

Figure 1:
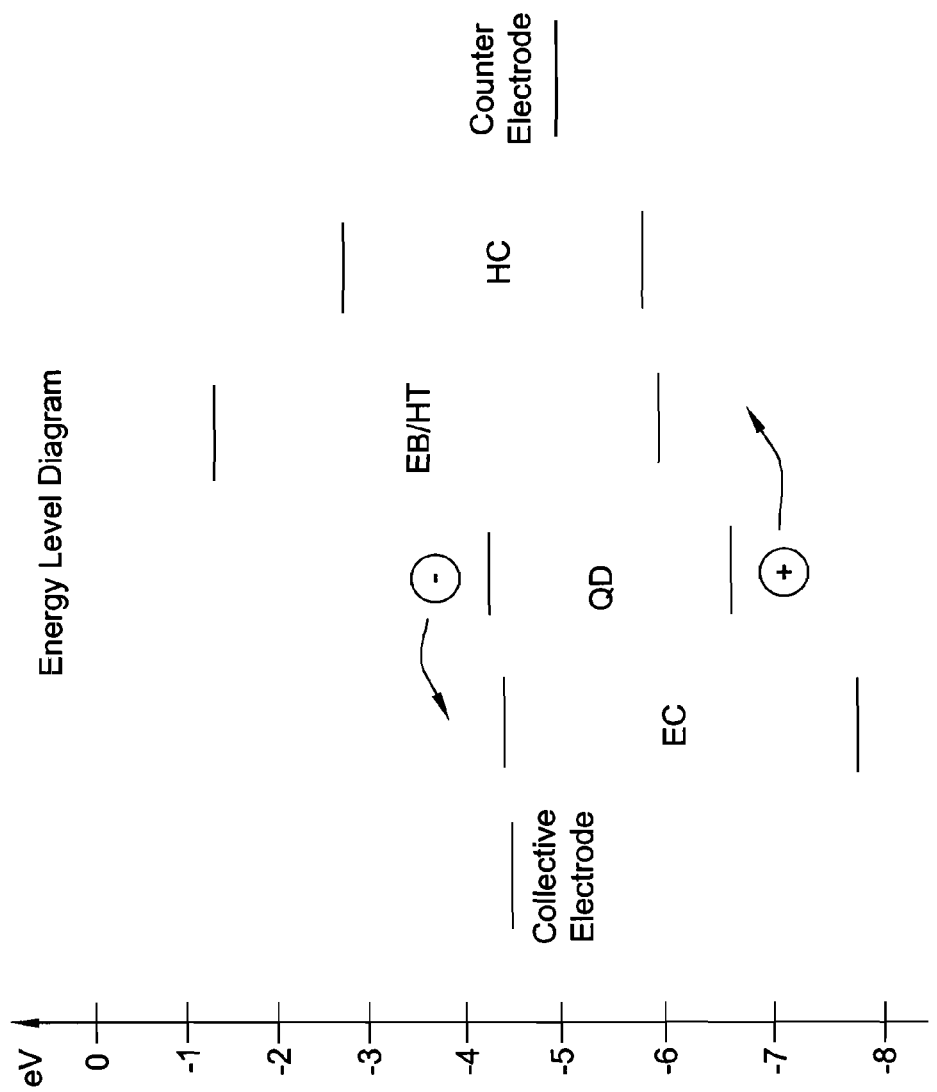
FIG. 1 is a schematic diagram of relative energy levels between components of an illustrative solar cell.

While the invention is amenable to various modifications and alternative forms, specifics thereof have been shown by way of example in the drawings and will be described in detail. It should be understood, however, that the intention is not to limit the invention to the particular illustrative embodiments described. On the contrary, the intention is to cover all modifications, equivalents, and alternatives falling within the spirit and scope of the invention.

DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

The disclosure relates generally to solar cells that include a layer or layers that reduce interfacial charge recombination for improved solar cell efficiency. In some instances, the solar cell may include an absorber material. The absorber material may be a material or material combination that absorbs photons from incident light and ejects one or more electrons in response to the absorbed photons.

In some cases, the absorber material may be a photo-sensitive or photo-excitable dye that can absorb one or more photons and correspondingly eject one or more electrons. It is contemplated that any suitable photo-excitable dye, assuming it can absorb photons within a given wavelength range or ranges, may be used. Illustrative but non-limiting examples of suitable photo-excitable dyes include complexes of transition metals such as ruthenium, such as ruthenium tris(2,2'bipyridyl-4,4'dicarboxylate), and osmium. Examples also include porphyrins such as zinc tetra (4-carboxylphenyl)porphyrin, cyanides such as iron-hexacyanide complexes and phthalocyanines.

Alternatively, or in addition, a solar cell may include quantum dots (QD) that can absorb one or more photons and correspondingly eject one or more electrons. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups II-VI, III-V, or IV-VI materials. Examples of specific pairs of materials for forming quantum dots (QD) may include but are not limited to MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb. It is contemplated that the quantum dots may be formed using any appropriate technique.

In some instances, a solar cell may include an electron conductor. In some cases, the electron conductor may be an n-type electron conductor, but this is not required. The electron conductor may be metallic and/or semiconducting, such as $TiO_2$ or ZnO. In some cases, the electron conductor may be an electrically conducting polymer such as a polymer that has been doped to be electrically conducting and/or to improve its electrical conductivity. In some instances, the electron conductor may be formed of titanium dioxide that has been sinterized.

In some cases, the solar cell may also include a hole conductor. A variety of hole conductors are contemplated. For example, when the electron conductor is an n-type conductor, the hole conductor may be a p-type conductor. The hole conductor may be metallic or semiconducting, and in some cases, may be a conductive polymer. When the hole conductor is a p-type conductive polymer, it is contemplated that any suitable p-type conductive polymer may be used. Illustrative but non-limiting examples of suitable p-type conductive polymers include polythiophenes such as poly(3-hexylthiophene), which has a LUMO (Lowest Unoccupied Molecular Orbital) value of −3 eV and a HOMO (Highest Occupied Molecular Orbital) value of −5 eV. Poly(3-hexylthiophene) includes the following repeating unit:

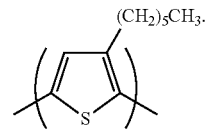

Another suitable polymer is MEH-PPV, or poly[2,5-dimethoxy-1,4-phenylene-1,2-ethenylene,2-methoxy-5-2-ethylhexyloxy-1,4-phenylene-1,2-ethylene). MEH-PPV has a LUMO value of −3 eV and a HOMO value of −5.2 eV. MEH-PPV includes the following repeating unit:

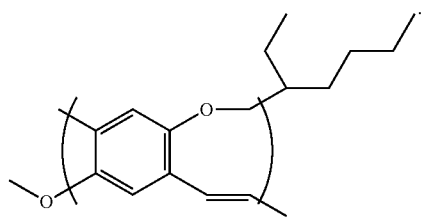

In some instances, the hole conductor may be TFB, or poly(9,9-dioctylfluorene-co-N-(4-(3-methylpropyl)-diphenylamine). TFB has a LUMO value of −2.3 eV and a HOMO value of −5.3 eV. TFB includes the following as a repeating unit:

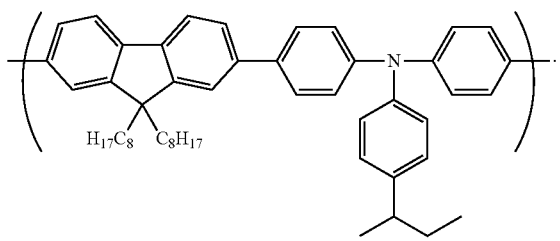

In some instances, the hole conductor may a non-polymeric organic molecule such as spiro-OMeTAD, or 2,2',7,7'-tetrakis(N,N-di-p-methoxyphenyl-amine)9,9'spirobifluorene. Spiro-OMeTAD has a LUMO value of −2.4 eV and a HOMO value of −5.4 eV. Spiro-OMeTAD has the following structure:

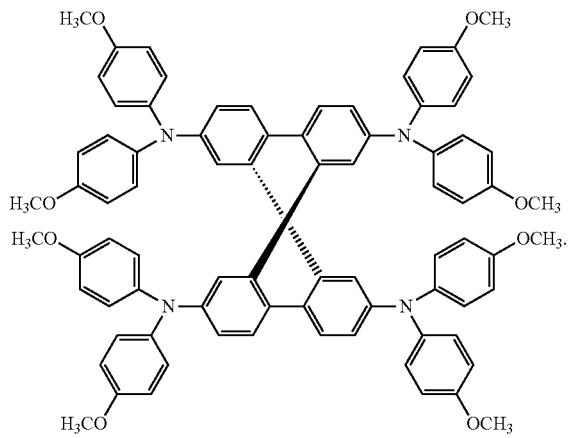

In some cases, the solar cell may include an electron inhibiting/hole transporting layer that may be configured to block electrons in either the absorber or the electron conductor from reaching the hole conductor. In some cases, the electron inhibiting/hole transporting layer may be configured to allow holes to move from the absorber to the hole conductor (e.g., to permit electrons to move from the hole conductor to the absorber).

The material or materials used to form the electron inhibiting/hole transporting layer may, in some cases, be subject to one or more constraints. For example, it may be useful to form the electron inhibiting/hole transporting layer from a material that is sufficiently transparent to incident light so that the incident light may reach the absorber material. In some cases, wide band-gap semiconductors having an $E_g$ (Energy Bandgap, or HOMO-LUMO) of greater than 3 eV (electron volts) may be useful. In many cases, the material may effectively block electron leakage to the hole conductor while efficiently transporting holes to the hole conductor. It may also be advantageous for the material to be relatively easily processed to form the electron inhibiting/hole transporting layer.

In some instances, the electron inhibiting/hole transporting layer may be formed of an inorganic material such as ZnS. A ZnS layer may be formed, for example, in-situ and/or using a core-shell structure. In some cases, the electron inhibiting/hole transporting layer may be formed of an organic material. An illustrative but non-limiting example of a suitable organic material is PVK, or poly(N-vinylcarbazole). PVK has a LUMO of about −1.2 to −2.1 eV and a HOMO of about −5.4 to about −6.1 eV. The PVK may, for example, be deposited onto an absorber layer such as a quantum dot anchor and/or may be doped into the hole conductor layer. PVK includes the following as a repeating unit:

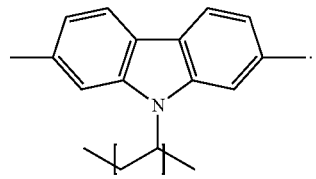

Another illustrative but non-limiting example of a suitable organic material is PFO, or poly(9,9-dioctylfluorenyl-2,7-diyl). PFO has a LUMO of about −2.1 eV and a HOMO of about −5.8 eV. PFO includes the following as a repeating unit:

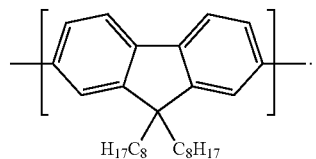

In some cases, PFO may be end-capped. An illustrative but non-limiting example of a suitable end-cap includes POSS, which is a polyhedral oligomeric silsequioxane having 8 silicon atoms. Seven of the Si atoms are bonded to cyclopentane while the 8$^{th}$ Si atom is bonded to a chlorophenyl moiety that can bond to PFO. To illustrate, PFO-POSS has the following structure:

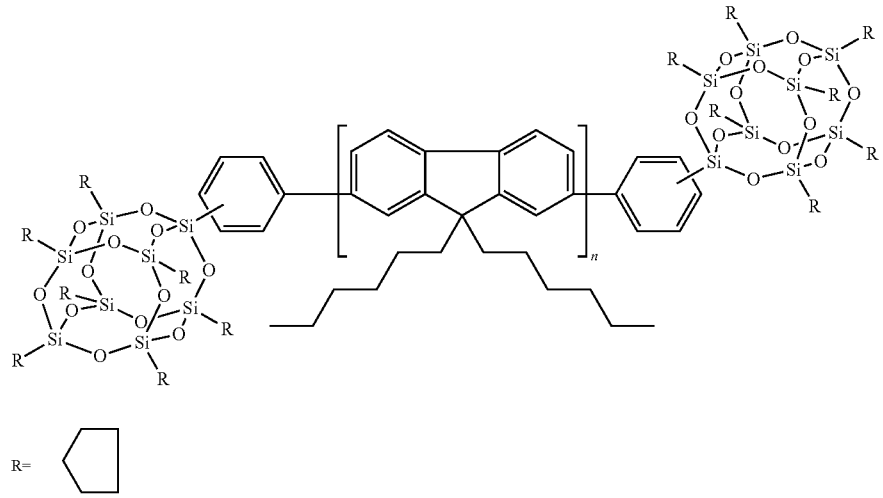

Another suitable end cap is N,N-Bis(4-methyl-phenyl)-4-aniline, which has the following structure:

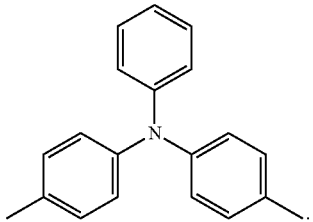

Another illustrative but non-limiting example of a suitable organic material is poly-TPD, or poly(N,N'-bis(4-butylphenyl)-N,N'-bis(phenyl)benzidine). Poly-TPD has a LUMO of about −2.5 eV and a HOMO of about −5.5 eV. Poly-TPD includes the following as a repeating unit:

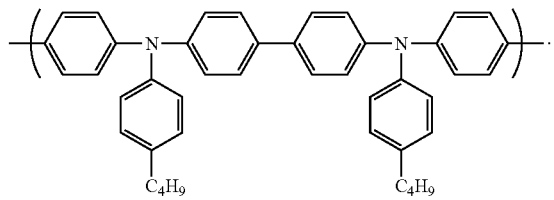

FIG. 1 provides an illustrative but non-limiting example of illustrative relative energy levels of an electron conductor (EC), an absorber (QD in this example), a hole conductor (HC), and an electron inhibiting/hole transporting layer (EB/HT). In FIG. 1, the HOMO is represented as the lower horizontal line and the LUMO is represented as the upper horizontal line shown for each of the electron conductor (EC), the absorber (QD in this example), the hole conductor (HC), and the electron inhibiting/hole transporting layer (EB/HT).

In some instances, as can be seen in FIG. 1, the electron inhibiting/hole transporting layer (EB/HT) may have a LUMO that is higher (less negative) than the corresponding LUMO of the absorber (QD) as well as being higher (less negative) than the corresponding LUMO of the electron conductor (EC). As a result, the electron inhibiting/hole transporting layer (EB/HT) may block or at least substantially inhibit the transfer of electrons in the absorber (QD) and/or the electron conductor (EC) from reaching the hole conductor (HC). In some cases, for example, the electron inhibiting/hole transporting layer (EB/HT) may have a HOMO that is near or in-between the corresponding HOMO of the hole conductor (HC) and the corresponding HOMO of the absorber (QD). As a result, holes may more easily transfer from the absorber (QD) to the hole conductor (HC).

As an illustrative but non-limiting example, and with reference to FIG. 1, the hole conductor (HC) may be Spiro-OMeTAD or TFB, as described above. These materials have LUMO values in the range of −2.3 to −2.4 eV and HOMO values in the range of −5.3 to −5.5 eV.

The electron inhibiting/hole transporting layer (EB/HT) may be PVK, which as described above, has a LUMO value of −1.2 eV and a HOMO value of −5.8 eV. As an example, the absorber (QD) may include CdSe quantum dots, which may have a LUMO value of −4.3 eV and a HOMO value of −6.6 eV. Thus, it can be seen that an electron inhibiting/hole transporting layer (EB/HT) of PVK has a LUMO value that is substantially higher (less negative) than either the CdSe quantum dots or the Spiro-OMeTAD or TFB hole conductor (HC). Moreover, it can be seen that the PVK electron inhibiting/hole transporting layer (EB/HT) has a HOMO value that is between the HOMO value of the hole conductor (HC) and the HOMO value of the absorber (QD).

Figure 2:
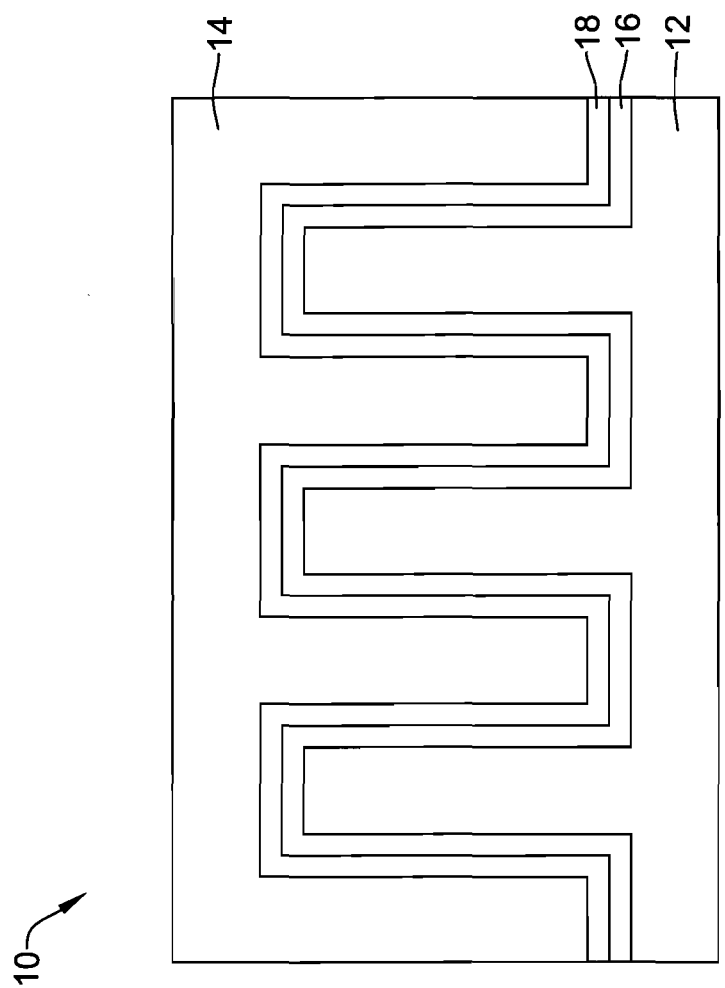
FIG. 2 is a schematic diagram of an illustrative but non-limiting solar cell.

FIG. 2 is a schematic view of an illustrative but non-limiting solar cell 10. The illustrative solar cell 10 includes an electron conductor layer 12 and a hole conductor layer 14. Electron conductor layer 12 may be formed of any suitable conductive material that can accept injected electrons. In some instances, electron conductor layer 12 may be or may include an n-type conductive material. In some cases, electron conductor layer 12 may include or otherwise be formed of sinterized titanium dioxide, but this is not required. Hole conductor layer 14 may be formed of any suitable material that can accept holes (e.g., donate electrons). In some instances, hole conductor layer 14 may be or may include one or more of the hole conductor materials discussed above.

The illustrative solar cell 10 of FIG. 2 also includes an absorber layer 16 disposed between the electron conductor layer 12 and the hole conductor layer 14. In some cases, absorber layer 16 may include a photosensitive dye such as those discussed above. In some instances, absorber layer 16 may include quantum dots, such as CdSe or PbS quantum dots. It is contemplated that solar cell 10 may also include an electron inhibiting/hole transporting layer 18 that may be made of any suitable material such as those discussed above. In the illustrative embodiment, the electron inhibiting/hole transporting layer 18 is provided between the absorber layer 16 and the hole conductor layer 14.

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification, Aug. 14, 2009

We claim:
1. A solar cell comprising:
   an electron conductor layer comprising titanium dioxide;
   a quantum dot layer comprising quantum dots;
   a hole conductor layer comprising at least one of poly(3-hexylthiophene), poly[2,5-dimethoxy-1,4-phenylene-1,2-ethenylene,2-methoxy-5-2-ethylhexyloxy-1,4-phenylene-1,2-ethylene), poly(9,9-dioctylfluorene-co-N-(4-(3-methylpropyl)-diphenylamine), or 2,2',7,7'-tetrakis(N,N-di-p-methoxyphenyl-amine)9,9'spirobifluorene;
   an electron inhibiting/hole transporting layer disposed between the quantum dot layer and the hole conductor layer, wherein the electron inhibiting/hole transporting layer comprises ZnS, poly(N-vinylcarbazole), poly(9,9-dioctylfluorenyl-2,7-diyl), or poly(N,N'-bis(4-butylphenyl)-N,N'-bis(phenyl)benzidine); and
   an absorber layer disposed between the electron conductor layer and hole conductor layer, the absorber layer comprising a photosensitive dye.

2. The solar cell of claim 1, wherein the electron inhibiting/hole transporting layer comprises poly(N-vinylcarbazole), poly(9,9-dioctylfluorenyl-2,7-diyl), or poly(N,N'-bis(4-butyl-phenyl)-N,N'-bis(phenyl)benzidine).

3. The solar cell of claim 1, wherein the hole conductor layer comprises 2,2',7,7'-tetrakis(N,N-di-p-methoxyphenyl-amine)9,9'spirobifluorene.

4. The solar cell of claim 1, wherein the hole conductor layer comprises poly(9,9-dioctylfluorene-co-N-(4-(3-methylpropyl)-diphenylamine).

5. The solar cell of claim 1, wherein the electron inhibiting/hole transporting layer is selected to have a LUMO that is greater than a corresponding LUMO of the absorber layer.

6. The solar cell of claim 1, wherein the electron inhibiting/hole transporting layer has a LUMO that is greater than a corresponding LUMO of the electron conductor layer.

7. The solar cell of claim 1, wherein the electron inhibiting/hole transporting layer comprises ZnS.

8. The solar cell of claim 1, wherein the electron conductor layer comprises titanium dioxide.

* * * * *